(12) United States Patent
Watanabe et al.

(10) Patent No.: US 6,459,139 B2
(45) Date of Patent: Oct. 1, 2002

(54) SEMICONDUCTOR DEVICE AND METHOD OF FABRICATING THE SAME

(75) Inventors: Kunio Watanabe, Sakata; Kazuhiko Okawa, Chino, both of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/727,705

(22) Filed: Dec. 4, 2000

(30) Foreign Application Priority Data

Dec. 3, 1999 (JP) .......................................... 11-344951

(51) Int. Cl.[7] .............................................. H01L 29/00
(52) U.S. Cl. ........................ 257/551; 257/603; 438/237
(58) Field of Search ................................ 438/237, 328, 438/380, 324, 326, 200; 257/551, 603

(56) References Cited

U.S. PATENT DOCUMENTS

| 4,402,003 A | * | 8/1983 | Blanchard .................... 257/337 |
| 5,162,966 A | * | 11/1992 | Fujihira ....................... 257/140 |
| 5,416,351 A | * | 5/1995 | Ito et al. ..................... 257/357 |
| 5,605,851 A | * | 2/1997 | Palmieri et al. ........ 148/DIG. 9 |
| 6,268,639 B1 | * | 7/2001 | Li et al. ..................... 257/107 |

FOREIGN PATENT DOCUMENTS

| JP | 1-259560 | 10/1989 |
| JP | 2-271673 | 11/1990 |
| JP | 2-271674 | 11/1990 |
| JP | 7-254574 | 10/1995 |
| JP | 11-233641 | 8/1999 |

* cited by examiner

*Primary Examiner*—Tuan H. Nguyen
(74) *Attorney, Agent, or Firm*—Oliff & Berridge, PLC

(57) ABSTRACT

The semiconductor device has an insulated-gate field-effect transistor (MOS transistor), a bipolar transistor, and a Zener diode. The MOS transistor is formed in a well of a first conductive type (p-type) and has a gate insulation layer, a gate electrode, side wall insulation layers, and second conductive type (n-type) of source and drain regions. The bipolar transistor has the drain region as a collector region, the well as a base region, and an n-type impurity-diffusion layer isolated from the drain region as an emitter region. The Zener diode is formed by the junction of an n-type impurity-diffusion layer continuous with the drain region and a p-type impurity-diffusion layer. The source and drain regions have a silicide layer formed on the surface thereof. A protection layer is formed on the surface of the n-type impurity-diffusion layer of the Zener diode.

6 Claims, 7 Drawing Sheets

SEMICONDUCTOR DEVICE AND METHOD OF FABRICATING THE SAME

BACKGROUND OF THE INVENTION

1. Field of the Invention

The present invention relates to a semiconductor device, particularly to a semiconductor device having high electrostatic breakdown resistance, and to a method of fabricating the same.

2. Description of Related Art

With the miniaturization of semiconductor devices, a technique of forming silicide layers on surfaces of impurity-diffusion layers constituting source and drain regions of a MOS transistor is widely used to reduce the parasitic resistance in the impurity-diffusion layer. The switching speed of MOS transistors can be increased by reducing the parasitic resistance in the source and drain regions in this manner, thereby increasing the operation speed.

However, in the case where a MOS transistor is used as a discharge element in the electrostatic protection circuit. built in an input/output circuit of a semiconductor integrated circuit device, reduction of the parasitic resistance in the source and drain regions decreases the electrostatic discharge (ESD) breakdown voltage. The major reason for the decrease in the ESD breakdown voltage is that the reduction of the parasitic resistance in the source and drain regions tends to cause current concentration, giving rise to thermal destruction.

To avoid decrease in the ESD breakdown voltage due to the reduction of the parasitic resistance in the source and drain regions, a technique of partially or completely preventing formation of a silicide layer in the source and drain regions of the MOS transistor as a discharge element has been known (Japanese patent application Laid-open No. 1-259560, No. 2-271673, and No. 2-271674).

However, this technique requires a protection process for partly removing the silicide layer from the source and drain regions of the MOS transistor. When the protection process is carried out in a salicide process for forming a siliside layer, following problems may occur. The problems become obvious for design rules of 0.8 $\mu$m or less, particularly of 0.35 $\mu$m or less.

Specifically, in the came of forming an oxide film on the entire surface of the wafer after forming the source and drain regions and then removing the oxide film by etching only in the area for forming a silicide layer, a side wall insulation layer which has been formed, is also partially removed. This may cause leakage between a gate electrode and the source/drain regions.

In a full salicide process in which a silicide layer is formed on both the gate electrode and the source/drain regions, it is very difficult in view of limitations to the process to selectively form a silicide layer on a gate electrode while preventing formation of a silicide layer in the vicinity of a drain junction. Specifically, since preventing formation of a silicide layer in the vicinity of the drain junction unavoidably accompanies formation of a mask (or an oxide layer) for preventing formation of a silicide layer on the gate electrode, a silicide layer is not formed on a part of the gate electrode, and the sheet resistance increases to several kilo ohms, for example. Consequently, high speed operations cannot be expected.

SUMMARY OF THE INVENTION

An objective of the present invention is to provide a semiconductor device which can be fabricated by utilizing a full salicide technique, can perform high-speed operations, and has a superior ESD breakdown voltage, and a method of fabricating such a semiconductor device.

According to a first aspect of the present invention, there is provided a semiconductor device comprising:

an insulated-gate field-effect transistor which is formed in a first region of a first conductive type and includes a gate insulation layer of a gate electrode, side wall insulation layers formed on side surfaces of the gate electrode, a first impurity-diffusion layer of a second conductive type which is a source region, and a second impurity-diffusion layer of the second conductive type which is a drain region;

a bipolar transistor which includes the second impurity-diffusion layer as a collector region, part of the first region as a base region, and a third impurity-diffusion layer of the second conductive type which is electrically isolated from the second impurity-diffusion layer and is used as an emitter region; and a Zener diode formed of a fourth impurity-diffusion layer of the second conductive type which is continuously formed with the second impurity-diffusion layer, and a fifth impurity-diffusion layer of the first conductive type which is connected to the fourth impurity-diffusion layer;

wherein silicide layers are formed on the surfaces of the first and second impurity-diffusion layers; and wherein a protection layer is formed on a surface of the fourth impurity-diffusion layer of the Zener diode.

This semiconductor device has the following effects.

(1) since a silicide layer can be formed in the source and drain regions of the insulated-gate field-effect transistor (hereinafter called AMOS transistor), the MOS transistor can be operated at a high speed without impairing the operation speed. Moreover, since the semiconductor device utilizes a Zener diode as a discharge element of an electrostatic protection circuit, a breakdown voltage between the collector and the base of the bipolar transistor can be decreased by the Zener diode. This ensures the bipolar transistor to be turned on reliably allowing an electrostatic charge to be discharged safely.

(2) Since a silicide layer is not formed on the impurity-diffusion layer constituting the Zener diode due-to the protection layer, changes in the impurity concentration in the impurity-diffusion layer to be caused by the silicide layer can be prevented. As a result, the Zener voltage (junction breakdown voltage) of the Zener diode does not change, thereby preventing malfunction.

(3) The Zener diode is composed of the impurity-diffusion layers differing from the impurity-diffusion layer (drain region) of the MOS transistor. Therefore, the impurity concentrations of the impurity-diffusion layers of the first and second conductive types can be appropriately determined. Consequently, the Zener voltage of the Zener diode can be easily and most suitably controlled.

The protection layer may be formed as follows. Since such protection layer can be formed in the fabrication step of the MOS transistor, the number of fabrication steps can be reduced.

The protection layer may be formed in a step of forming the side wall insulation layers.

The protection layer may comprise an insulation layer formed together with the gate insulation layer, a conductive layer formed together with the gate electrode, and another insulation layer formed together with the side wall insulation layers.

The Zener diode may have a Zener voltage which is met to be lower than the avalanche breakdown voltage in the drain region. This enables to reliably cause the Zener breakdown in the Zener diode prior to the occurrence of the avalanche breakdown in the parasitic bipolar transistor. As a result, the bipolar transistor can be turned on instead of the parasitic bipolar transistor.

The Zener diode may have a Zener voltage which is set to be lower than the snapback voltage in the drain region of the MOS transistor. This causes a current to be discharged constantly through the bipolar transistor. As a result, shifting of the path of the discharging current from the bipolar transistor to the parasitic bipolar transistor can be prevented with certainty, thereby preventing electrostatic breakdown of the MOS transistor.

The fourth impurity-diffusion layer of the Zener diode may have an impurity concentration lower than the impurity concentration of the drain region. This is because the fourth impurity-diffusion layer preferably has a high resistance to prevent the current concentration at the boundary between the fourth impurity-diffusion layer and the isolation region when an electric charge is injected due to static electricity.

According to a second aspect of the present invention, there is provided a method of fabricating a semiconductor device comprising the steps of:

(a) forming a gate electrode on a first region of a first conductive type with a gate insulation layer interposed;

(b) doping the first region with impurities to form an impurity-diffusion layer of the first conductive type which is used for forming a Zener diode;

(c) forming an insulation layer on a wafer, part of the insulation layer being used for forming side wall insulation layers of the gate electrode;

(d) forming a mask layer on part of the insulation layer which corresponds to a region in which the Zener diode is formed;

(e) etching part of the insulation layer by anisotropic etching to form the sidewall insulation layers on side surfaces of the gate electrode together with a protection layer which covers the region in which the Zener diode is formed;

(f) forming impurity-diffusion layers of a second conductive type which are used to form source and drain regions; and (g) forming silicide layers at least on the surfaces of the impurity-diffusion layers of the second conductive type which are used to form the source and drain regions.

This fabrication method has the following effects.

(1) This method can prevent problem caused by a conventional protection method which comprises the steps of forming source and drain regions, forming an oxide film over the entire surface of a wafer, and then performing the salicide process by removing the oxide film by etching only in the area for forming a silicide layer. The present method does not include the step of removing the oxide film by etching only in the area for forming a silicide layer in the salicide process, thereby preventing part of the side wall insulation layers from being removed. As a result, the breakdown voltage between the gate electrode and the source/drain regions can be sufficiently increased, thereby preventing occurrence of leakage.

(2) since the protection layer can be formed in the step of forming the side wall insulation layers and it is unnecessary to form an oxide film for masking and perform patterning in the salicide process, the number of fabrication steps can be reduced in comparison with a conventional method.

(3) It is possible to apply a full salicide process in which a silicide layer is formed on both the gate electrode and the source/drain regions.

In the step (f), another impurity-diffusion layer of the second conductive type which is electrically isolated from the drain region may be formed and used for forming an emitter region of a bipolar transistor. Since the emitter region is simultaneously formed in the step of forming the source and drain regions of the MOS transistor by providing this step, the number of fabrication steps can be reduced.

The impurity-diffusion layer of the second conductive type forming part of the Zener diode may be formed as follows. According to the following, the impurity-diffusion layer of the second conductive type to be used for forming the Zener diode can be formed in the step of forming the source and drain regions of the MOS transistor, thereby reducing the number of fabrication steps.

In the step (b), an impurity-diffusion layer of the second conductive type to be used for forming a Zener diode may be formed.

In the step (f), an impurity-diffusion layer of the second conductive type to be used for forming a Zener diode may be formed by doping the first region with impurities with the protection layer formed in the step (e) interposed.

Prior to the step (c), a predetermined area of the first region may be doped with impurities of the second conductive type having a, low concentration to form impurity-diffusion layers of the second conductive type which have low concentrations and are used for forming the source and drain regions, and also to form an impurity-diffusion layer of the second conductive type to be used for forming a Zener diode.

According to a third aspect of the present invention, there is provided a method of fabricating a semiconductor device comprising the steps of:

(a) doping a first region of a first conductive type with impurities to form an impurity-diffusion layer of the first conductive type and an impurity-diffusion layer of a second conductive type both of which are used for forming a Zener diode;

(b) forming a gate electrode on the first region with a gate insulation layer interposed;

(c) forming side wall insulation layers on side surfaces of the gate electrode;

(d) forming impurity-diffusion layers of the second conductive type to be used for forming source and drain regions, and (e) forming silicide layers at least on the surfaces of the impurity-diffusion layers of the second conductive type to be used for forming the source and drain regions, wherein, in the steps (b) and (c), a protection layer including an insulation layer formed together with the gate insulation layer, a conductive layer formed together with the gate electrode, and another insulation layer formed together with the side wall insulation layers is formed on a region in which the Zener diode is formed; and wherein the impurity-diffusion layer of the second conductive type to be used for forming the Zener diode is covered with the protection layer.

This fabrication method has the same effects as the above-described first fabrication method.

In the step (d) of this fabrication method, or in the step of forming the impurity-diffusion layers of the second conductive type to be used for forming the source and drain regions, an impurity-diffusion layer of the second conductive type

DETAILED DESCRIPTION OF THE PREFERRED EMBODIMENTS

First Embodiment

Figure 1:
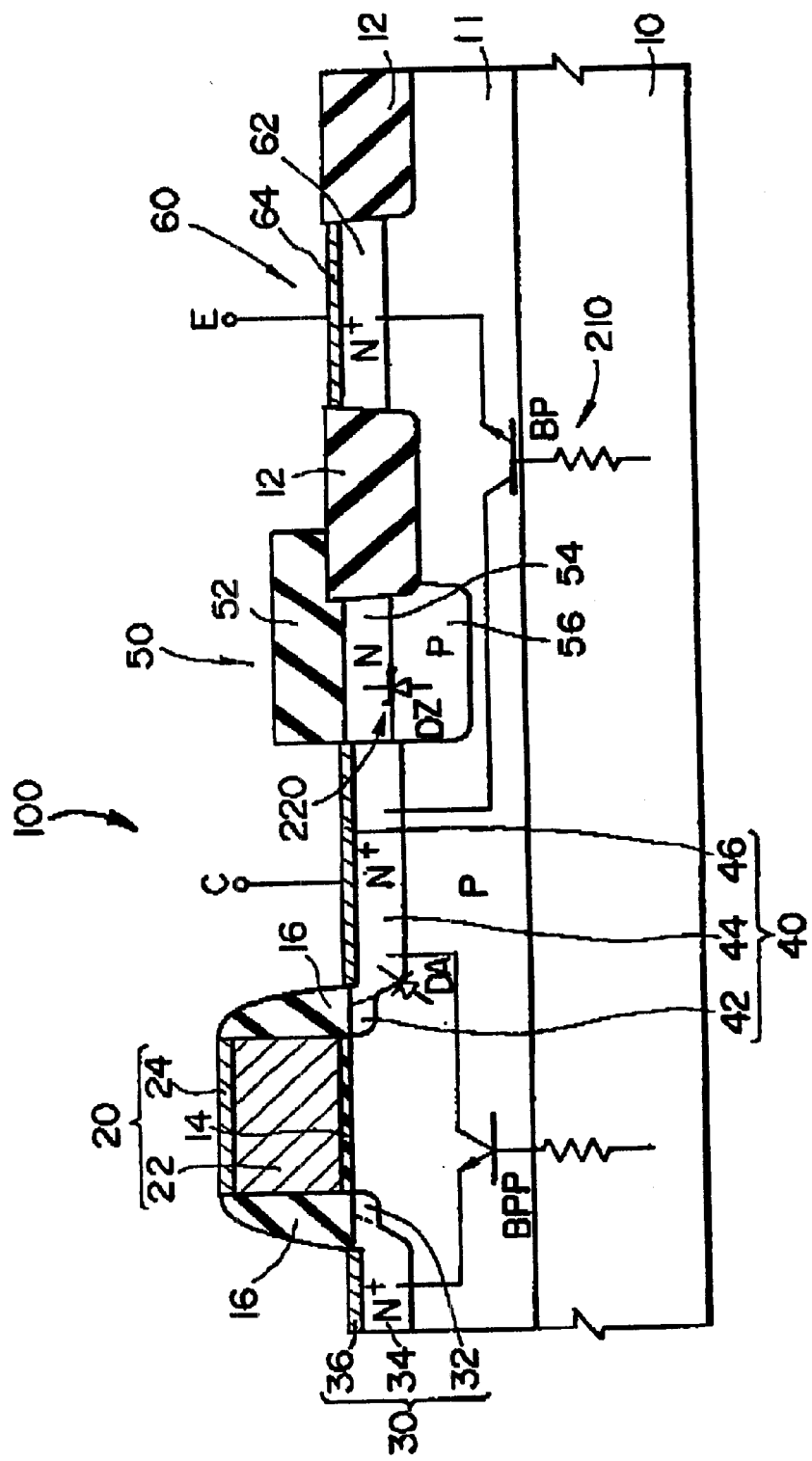
FIG. 1 is a cross section schematically showing a semiconductor device according to a first embodiment of the present invention.
Figure 2:
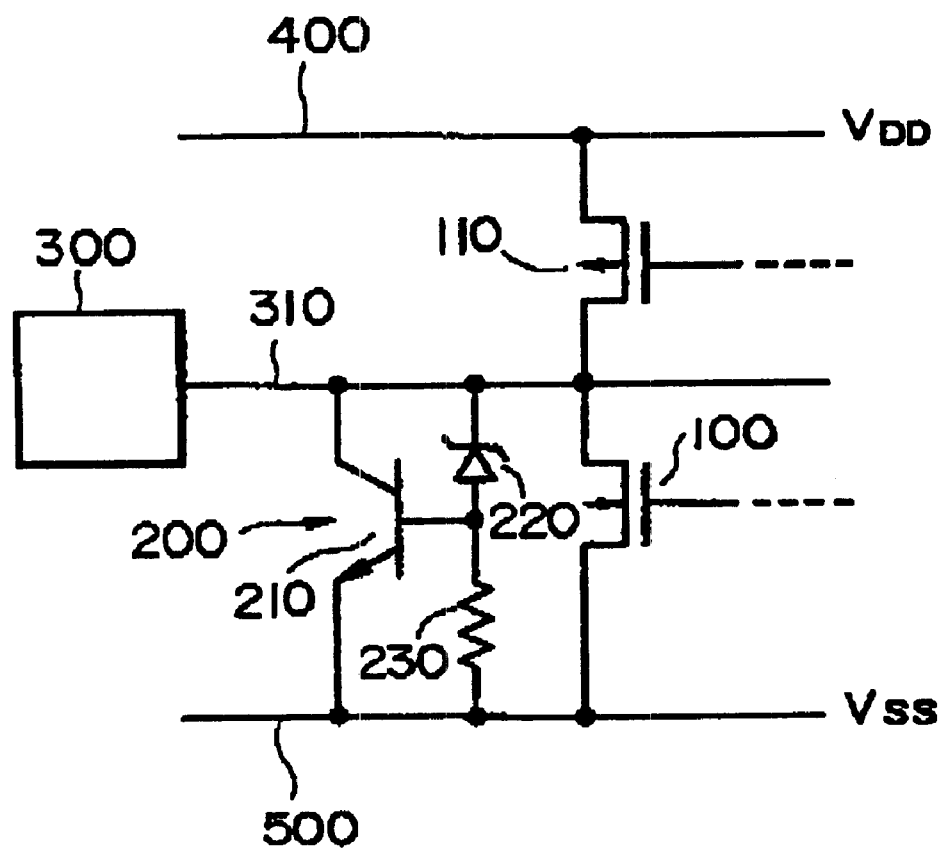
FIG. 2 shows an equivalent circuit of an output circuit to which the semiconductor device shown in FIG. 1 is applied.

FIG. 1 is a cross section schematically showing a first embodiment of the semiconductor device according to the present invention. FIG. 2 is an equivalent circuit diagram of an example of an input/output circuit of a semiconductor device to which the present invention is applied. In the present embodiment, an example in which the present invention is applied to an output circuit including a MOS-type output transistor will be described. FIG. 2 shows an equivalent circuit of an output cell. The present embodiment will be described on the assumption that first conductive type is p-type and second conductive type is n-type.

Device Structure

The semiconductor device according to the present embodiment includes a MOS transistor 100 and discharge elements constituting an electrostatic protection circuit 200. This example illustrates a structure using an n-channel MOS transistor.

The semiconductor device includes a p-type well (a first region of the first conductive type) 11 formed in a p-type silicon substrate 10. An isolation region 12 with a predetermined pattern is formed on the p-type well by selective oxidation, for example. An n-channel MOS transistor 100, a diode region 50 including a Zener diode (DZ) 220, and a bipolar transistor (BP) 210 are formed in the regions other than the isolation region.

The MOS transistor 100 includes a gate insulation layer 14, a gate electrode 20, a source region (first impurity-diffusion layer) 30, and a drain region (second impurity-diffusion layer) 40. The gate electrode 20 includes a first conductive layer 22 formed of a doped polysilicon layer and a second conductive layer 24 composed of a silicide layer formed on the conductive layer 22 side wall insulation layers 16 are formed on side surfaces of the gate electrode 20. The source region 30 and the drain region 40 of an LDD structure are formed on side surfaces of the gate electrode 20 in the p-type well 11. The source region 30 includes a low-concentration n-type impurity-diffusion layer 32, a high-concentration n-type impurity-diffusion layer 34, and a silicide layer 36 , The drain region 40 includes a low-concentration n-type impurity-diffusion layer 42, a high-concentration n-type impurity-diffusion layer 44, and a silicide layer 46.

The diode region 50 is formed between the MOS transistor 100 and the isolation region 12. The diode region 50 includes a protection layer 52 formed on the p-type well 11, and an n-type impurity-diffusion layer (fifth impurity-diffusion layer) 54 and a p-type impurity-diffusion layer (sixth impurity-diffusion layer) 56 both formed in the p-type well 11-under the protection layer 52. The n-type impurity-diffusion layer 54 and p-type impurity-diffusion layer 56 constitute a Zener diode (DZ) 220.

The n-type purity-diffusion layer 54 is disposed between the drain region 40 of the MOS transistor 100 and the isolation region 12. The n-type impurity-diffusion layer 54 may have high resistance in order to prevent the current concentration at the boundary between the impurity-diffusion layer 54 and the isolation region 12. Therefore, the impurity-diffusion layer 54 has an impurity concentration lower than that of the impurity-diffusion layer 44 in the drain region 40.

The p-type impurity-diffusion layer 56 is formed under the n-type impurity-diffusion layer 54. The impurity concentrations of the n-type impurity-diffusion layer 54 and the p-type impurity-diffusion layer 56 are determined so that the Zener voltage of the Zener diode (DZ) formed by these layers becomes a predetermined value.

The protection layer 52 in the diode region 50 is formed to sufficiently cover the surface of the n-type impurity-diffusion layer 54 which constitute part of the Zener diode (DZ) 220 so that part of the isolation region 12 and the drain region 40 are also covered by the protection layer 52. By thus forming the protection layer 52, a silicide layer is not formed on the surface of the n-type impurity-diffusion layer 54 constituting part of the Zener diode (DZ). This prevents impurities in the n-type impurity-diffusion layer 54 from being absorbed into the silicide layer to change the impurity concentration in the n-type impurity-diffusion layer 54. Therefore, malfunction such as changes in the Zener voltage and junction breakdown voltage due to changes in the impurity concentration in the n-type impurity-diffusion layer 54 does not occur. The protection layer 52 is formed in the step of forming the side wall insulation layers 16 of the MOS transistor 100, as described later.

An emitter region (third impurity-diffusion layer) 60 is formed apart from the diode region 50 with the isolation region 12 therebetween. The emitter region 60 includes a high-concentration n-type impurity-diffusion layer 62 formed in the p-type well 11 and a silicide layer 64 formed on the impurity-diffusion layer 62.

In this semiconductor device, a lateral bipolar transistor 210 is composed of the drain region 40 of the MOS transistor 100 as a collector region, p-type well 11 as a base region and the emitter region 60, as shown in the equivalent circuit in FIGS. 2.

Electrostatic Protection Circuit

An example of an output circuit comprising an electrostatic protection circuit will be described with reference to FIGS. 1 and 2.

This output circuit has as a discharge element an electrostatic protection circuit 200 including the bipolar transistor 210 and the Zener diode 220. The electrostatic protection circuit 200 is connected between an output line 310 from an output pad 300 and a ground line (first reference power supply line) 500 in parallel with the n-channel MOS transistor 100 which functions as an output transistor. A p-channel MOS transistor 110 is connected between the output line 310 and a high potential power supply line (second reference power supply line) 400.

The bipolar transistor 210 constituting part of the electrostatic protection circuit 200 includes an emitter connected to the ground line 500, a collector connected to the output line 310, and a base connected to the ground line 500 through a resistor 230. The Zener diode 220 is connected between the base of the bipolar transistor 210 and the output line 310.

This electrostatic protection circuit enables to reliably cause Zener breakdown in the the Zener diode (DZ) 220 prior to the occurrence of avalanche breakdown in a parasitic diode DA formed by the junction of the drain region 40 and the p-type well 11, when a high-voltage pulse is applied to the output pad 300. Therefore, the bipolar transistor (BP) 210 can be turned on without turning on a parasitic transistor BPP composed of an n-type impurity-diffusion layer as the source region 30, p-type well 11, and another n-type impurity-diffusion layer as the drain region 40. Consequently, this prevents a large current from flowing through the parasitic transistor BPP, thereby preventing the MOS transistor 100, especially the gate insulation layer, from electrostatic breakdown.

Taking the functions of the Zener diode (DZ) 220 into consideration, it is preferable that the Zener diode (DZ) satisfies the following conditions.

(1) The Zener voltage of the Zener diode (DZ) 220 is set to be lower than the avalanche breakdown voltage in the drain region 40 of the MOS transistor (output transistor) 100. This enables to reliably cause Zener breakdown in the Zener diode (DZ) 220 prior to the occurrence of the avalanche breakdown in the the parasitic bipolar transistor BPP. Therefore, the bipolar transistor (BP) 210 can be turned on instead of the parasitic bipolar transistor BPP.

(2) The Zener voltage of the Zener diode (DZ) 220 is set to be lower than the snapback voltage in the drain region 40 of the MOS transistor 100. This makes it possible to stably flow a discharge current through the bipolar transistor BP. Specifically, such setting enables to clamp the drain voltage to a level below the snapback voltage when a high voltage is applied. If the drain voltage can be clamped to a level below the snapback voltage, the parasitic bipolar transistor BPP is not turned on without fail even if the avalanche breakdown occurs in the parasitic diode DA. As a result of this, the discharging path can be prevented with certainty from changing from the bipolar transistor BP to the parasitic bipolar transistor BPP, thereby preventing electrostatic breakdown of the MOS transistor 100.

In the present embodiment, the Zener voltage of the Zener diode (DZ) depends on the impurity concentrations in the n-type impurity-diffusion layer 54 and the p-type impurity-diffusion layer 56 constituting the Zener diode (DZ). For example, by adjusting the impurity concentration of the n-type impurity-diffusion layer 54 and the p-type impurity-diffusion layer 56 to about $1 \times 10^{15}/cm^3$, the Zener voltage becomes about 6 V.

As described above, the electricstatic protection circuit of the present embodiment can reliably protect the internal elements from a surge such as static electricity without using resistors which impair high speed operation.

Although FIG. 2 shows an output circuit, the electrostatic protection circuit to which the present invention is applied can also be applied to an input circuit.

The semiconductor device of the present embodiment has the following effects.

(1) Since the silicide layers 36 and 46 are formed on the source region 30 and drain region 40 of the NOS transistor 100, high speed operations can be ensured without decreasing the operation speed of the MOS transistor. Moreover, since the semiconductor device includes the Zener diode (DZ) 220 as a discharge element of an electrostatic protection circuit, it is possible to decrease the breakdown voltage between the collector and the base of the bipolar transistor BP to reliably operate the bipolar transistor (BP) 210. This enables good electrostatic discharge.

(2) Since a silicide layer is not formed on the impurity diffusing layers of the Zener diode (DZ) 220 due to the protection layer 52, the Zener voltage (junction breakdown voltage) of the Zener diode (DZ) does not change as described above, thereby preventing malfunction.

(3) Since the Zener diode (DZ) 220 is formed of impurity-diffusion layers which are different from the impurity-diffusion layer (drain region 40) of the MOS transistor 100, the impurity concentrations of the n-type impurity-diffusion layer 54 and the p-type impurity-diffusion layer 56 can be properly determined. Therefore, the Zener voltage of the Zener diode (DZ) can be easily determined at an optimum value.

Device Fabrication Method

An example of the method of fabricating the semiconductor device of the present embodiment will be described with reference to FIG. 1 and FIGS. 3 to 7. This example will be described using an n-channel MOS transistor.

Figure 3:
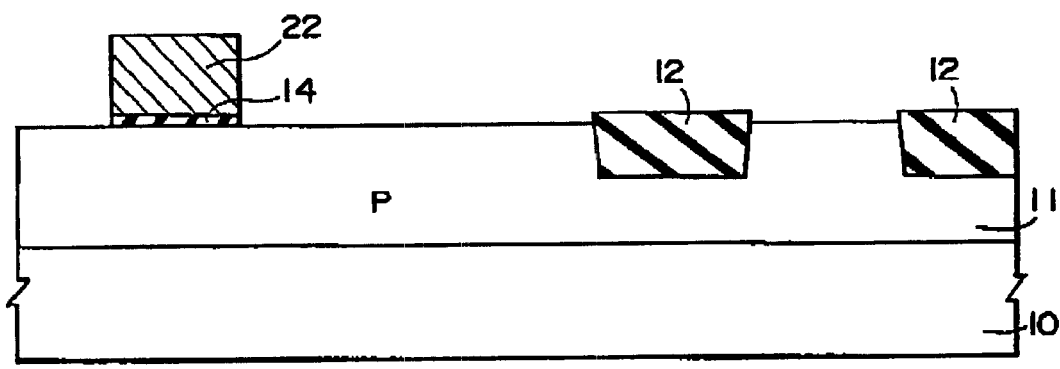
FIG. 3 is a cross section schematically showing a fabrication step of the semiconductor device shown in FIG. 1.
Figure 4:
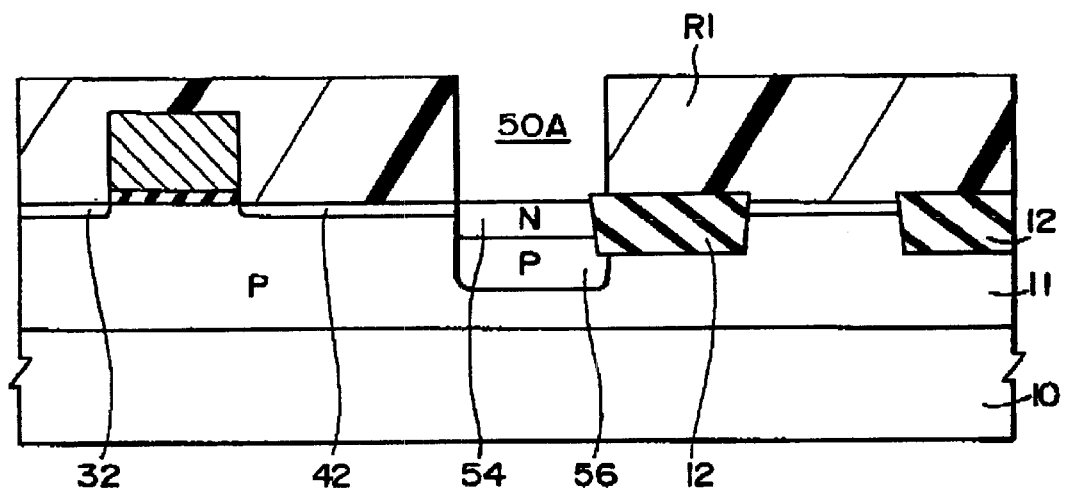
FIG. 4 is a cross section schematically showing a fabrication step of the semiconductor device shown in FIG. 1.

(A) As shown in FIG. 3, a p-type well 11, an isolation regions 12, and a doped polysilicon layer (first conductive layer 22) forming part of a gate electrode are formed on a silicon substrate 10 using a known method. For example, the p-type well 11 is formed by ion implantation of p-type impurities such as boron into a predetermined region of the silicon substrate 10. The isolation regions 12 with a predetermined pattern are formed on the silicon substrate 10 by selective oxidation, for example. The gate insulation layer 14 is formed on the active region by thermal oxidation, for example. The first conductive layer 22 can be formed by forming a polysilicon layer using a CVD method and patterning the layer using photolithography and etching. The doped polysilicon layer forming the first conductive layer 22 may be formed by doping the polysilicon layer with impurities during formation of the polysilicon layer using a CVD method or after forming the polysilicon layer.

(B) A resist layer R1 having an opening 50A in the area for forming a diode region 50 is formed, as shown in rig. 4. The p-type impurity-diffusion layer 66 is then formed by ion implantation of p-type impurities into the p-type well 11 using the resist layer R1 as a mask. An n-type impurity-diffusion layer 54 is formed by ion implantation of n-type impurities into the p-type well 11 using the resist layer R1 as a mask. The impurity concentration and the diffusion depth of these impurity-diffusion layers 54 and 56 are determined so as to form, a Zener diode. The order of forming the impurity-diffusion layers 54 and 56 is not limited.

A low-concentration n-type impurity-diffusion layers 32 and 34 to be used for forming the source region 30 and drain region 40 are formed by using a resist layer (not shown in the Figures) as a mask. These impurity-diffusion layers 32 and 42 may be formed either before or after forming the impurity-diffusion layers 54 and 56 of the Zener diode.

Figure 5:
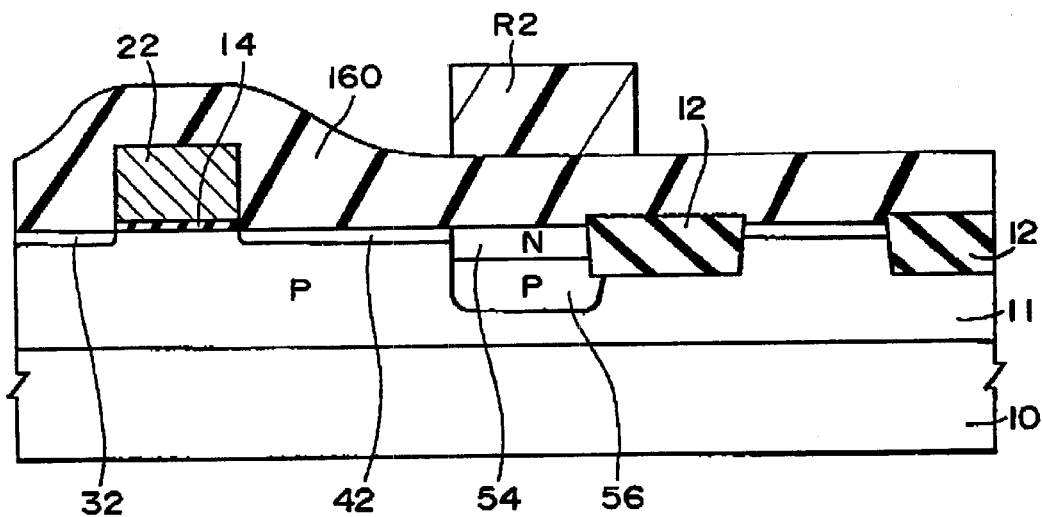
FIG. 5 is a cross section schematically showing a fabrication step of the semiconductor device shown in FIG. 1.

(C) An insulation layer 160 is then formed on the entire surface of the wafer for forming side wall insulation layers 16, as shown in FIG. 5. The insulation layer 160 is formed by depositing silicon oxide using a known method such an a CVD method. Then, a resist layer R2 in formed on the insulation layer 160 in the area for forming a diode region 50.

Figure 6:
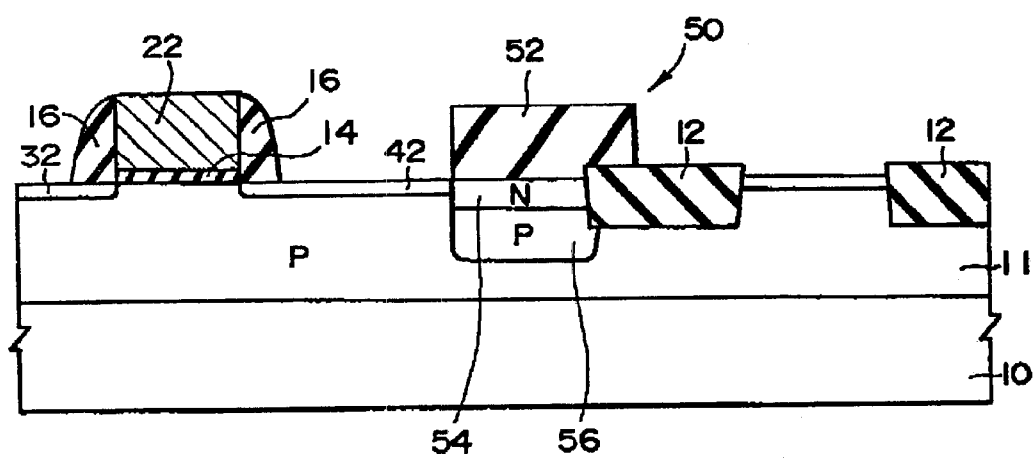
FIG. 6 is a cross section schematically showing a fabrication step of the semiconductor device shown in FIG. 1.

The insulation layer 160 is then etched all over the surface by isotropic etching using dry etching. Consequently, the side wall insulation layers 16 are formed an side surface of the gate insulation layer 14 and the first conductive layer 22 forming part of the gate electrode. At the same time a protection layer 52 is formed on the n-type impurity-diffusion layer 54, as shown in FIG. 6.

The protection layer 52 is formed to sufficiently cover the surface of the n-type impurity-diffusion layer 54 forming part of the Zener diode (DZ) so that part of the isolation region 12 and drain region 40 are also covered by the protection layer 52, as described above. The diode region 50 is composed of the p-type impurity-diffusion layer 56 and the n-type impurity-diffusion layer 54 formed in the step (B) and the protection layer 52 formed in this step.

Figure 7:
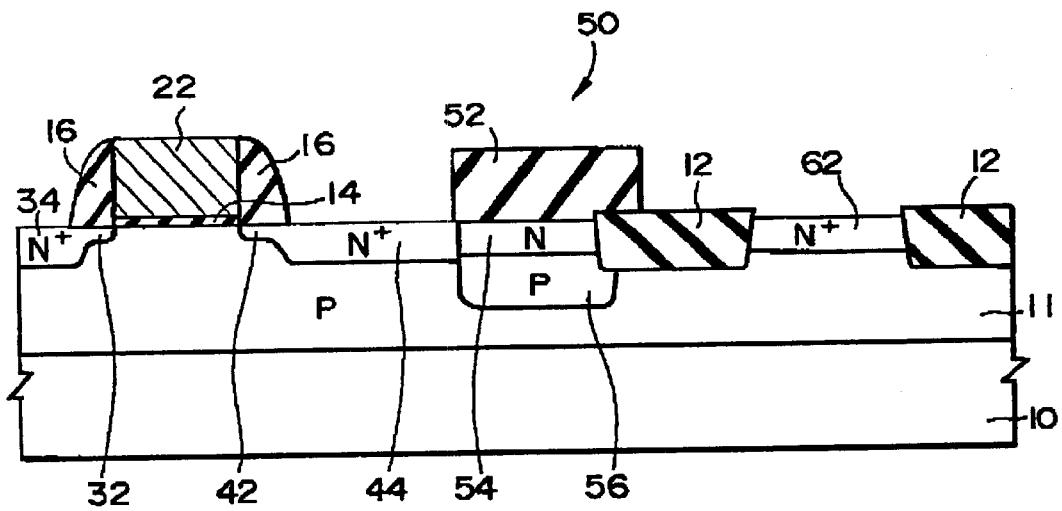
FIG. 7 is a cross section schematically showing a fabrication step of the semiconductor device shown in FIG. 1.

(D) A high-concentration impurity-diffusion layer 34 for the source region, a high-concentration impurity-diffusion layer 44 for the drain region, and a high-concentration impurity-diffusion layer 62 for the emitter region are formed by ion implantation of n-type impurities such as phosphorus or arsenic using a known method, as shown in FIG. 7. Since the side wall insulation layers 16, protection layer 52, and isolation regions 12 function as masks for ion implantation, the high-concentration impurity-diffusion layers 34, 44, and 62 are formed while being self-aligned.

(E) A silicide layer is formed on the exposed area of the silicon substrate 10 and the surface of the doped polysilicon layer (first conductive layer 22) by a known salicide process, as shown in FIG. 1. Specifically, silicide layers 24, 36, 46, and 64 formed of a metal such as titanium, tungsten, molybdenum, tantalum, or cobalt are formed on the first conductive layer 22, high-concentration impurity-diffusion layer 34 for the source region, high-concentration impurity-diffusion layer 44 for the drain region, and high-concentration impurity-diffusion layer 62 for the emitter region, respectively. Consequently, the gate electrode 20, source region 30, drain region 40 constituting the MOS transistor 100 and the emitter 60 are formed in this step.

An example of the salicide process used in this step is as follows. After sputtering titanium on the wafer in a thickness of from about 30 nm to about 100 nm, the wafer is subjected to an instant annealing at a temperature of from 650° C. to 750° C. for a time of from a few seconds to about 60 seconds in a nitrogen atmosphere with an oxygen content of 50 ppm or less. Then, a titanium monosilicide layer is formed on the surfaces of the exposed silicon substrate and the polysilicon layer and a titanium-rich titanium nitride layer is formed on the insulation layers formed of silicon oxide (side wall insulation layers 16, protection layer 52, and isolation regions 12 in FIG. 1). The wafer is then immersed in an aqueous solution of a mixture of ammonium hydroxide and hydrogen peroxide to remove the titanium nitride layer by etching. An a result, the titanium monosilicide layer remains only on the surfaces of the silicon substrate and polysilicon layer. The wafer is subjected to lamp annealing at a temperature of from 750° C. to 850° C. to convert the monosilicide layer into disilicide, thereby causing titanium silicide layers to be formed self-aligned. In this manner, the silicide layers 36 and 46 constituting part of the source region 30 and the drain region 40 and the silicide layer 64 constituting part of the emitter region 60 are formed on the silicon substrate 10. A silicide layer for forming a second conductive layer 24 is formed on the surface of the first conductive layer 22 formed of the doped polysilicon layer.

The fabrication method according to the present embodiment has the following effects.

(1) This method can prevent problems caused by a conventional protection method which comprises the steps of forming source and drain regions, forming an oxide film over the entire surface of a wafer, and then performing the salicide process by removing the oxide film by etching only in the area for forming a silicide layer. The present method does not include the steps of removing the oxide film by etching only in the area for forming a silicide layer in the salicide process, thereby preventing part of the side wall insulation layer from being removed. As a result, the breakdown voltage between the gate electrode 20 and the source/drain regions 30 and 40 can be sufficiently increased, thereby preventing occurrence of leakage.

(2) Since the protection layer 52 can be formed in the step of forming the side wall insulation layers 16 of the gate electrode 20 and it is unnecessary to form an oxide film for masking and perform patterning in the salicide process, the number of fabrication steps can be reduced in comparison with a conventional protection method.

(3) It is possible to apply a full salicide process in which a silicide layer is formed on both the gate electrode 20 and the source/drain regions 30 and 40.

Second Embodiment

Figure 8:
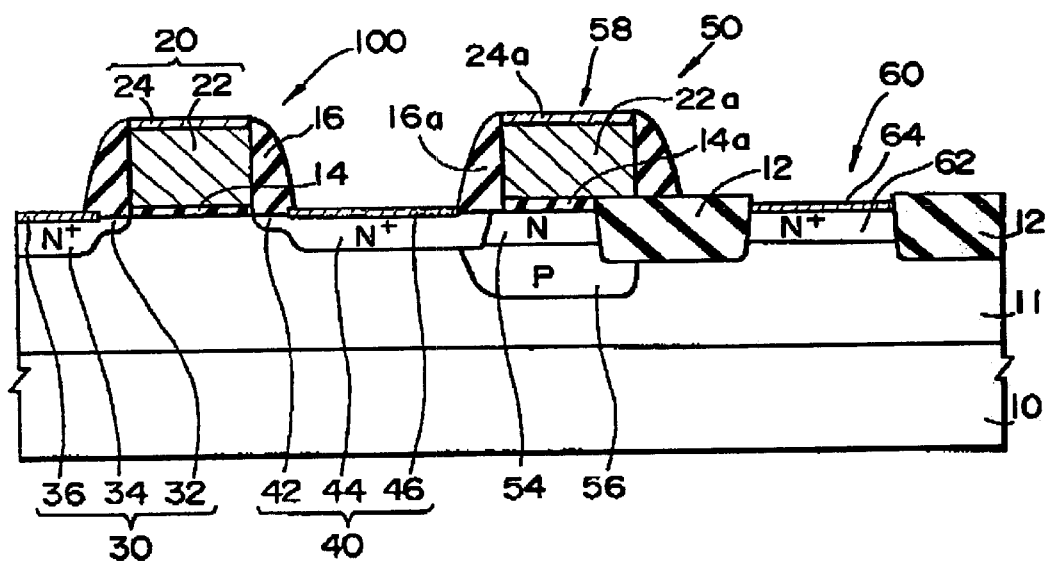
FIG. 8 is a cross section schematically showing a semiconductor device according to a second embodiment of the present invention.

FIG. 8 is a cross section schematically showing a second embodiment of the semiconductor device according to the present invention. In the present embodiment, components having the same functions as those of the first embodiment are denoted by the same reference numbers, and detailed description thereof will be omitted.

Device Structure

The semiconductor device according to the present embodiment includes a protection layer 58 in the diode region 50 having a structure differing from the protection layer 52 of the semiconductor device according to the first embodiment. The following description will be mainly focussed on the protection layer 58.

The semiconductor device according to the present. embodiment has an n-channel MOS transistor 100, a diode region 50 including a Zener diode (DZ) 220, and a bipolar transistor (BP) 210 as in the first embodiment.

The diode region 50 is formed between the MOS transistor 100 and an isolation region 12. The diode region 50 includes a protection Layer 58 formed on the silicon substrate 20, and an n-type impurity-diffusion layer (fifth impurity-diffusion layer) 54 and a p-type impurity-diffusion layer (sixth impurity-diffusion layer) 56 formed under the protection layer 58. The Zener diode in composed of the n-type impurity-diffusion layer 54 and the p-type impurity-diffusion layer 56.

In this semiconductor device, the protection layer 58 in the diode region 50 is formed in the step of forming a gate electrode of the MOS transistor 100. Therefore, the protection layer 58 has the same cross sectional structure as that of the gate electrode of the MOS transistor 100.

Specifically, the protection layer 58 includes an insulation layer 14a formed together with the gate insulation layer 14 of the MOS transistor 100, a conductive layer 22a formed together with the first conductive layer 22 which is formed of a doped polysilicon layer, a silicide layer 24a formed together with the second conductive layer 24 which is formed of a silicide Layer, and side wall insulation layers 16a formed together with the side wall insulting layers 16.

The protection layer 58 is formed to sufficiently cover the surface of the n-type impurity-diffusion layer 54 constituting part of the Zener diode so that part of the isolation region 12 and drain region 40 are also covered by the protection layer 58. By providing the protection layer 58, a silicide layer will not be formed on the surface of the n-type impurity-diffusion layer 54 constituting part of the Zener diode. This prevents impurities in the n-type impurity-diffusion layer 54 from being absorbed into the silicide layer to change the impurity concentration in the n-type impurity-diffusion layer 54. Therefore, malfunction such as changes in the Zener voltage of the Zener diode or the junction breakdown voltage resulting from the changes in the impurity concentration in the n-type impurity-diffusion layer 54 does not occur.

Since the MOS transistor 100 and the emitter region (the third impurity-diffusion layer) 60 are the same as those in the. first embodiment, description thereof is omitted.

In this semiconductor device, a lateral bipolar transistor 210 is composed of the drain region 40 of the MOS transistor 100 as a collector region, the p-type well 11 an a base region, and the emitter region 60 as in the first embodiment.

The semiconductor device according to the present embodiment also has the same effects as the semiconductor device of the first embodiment.

Device Fabrication Method

Figure 9:
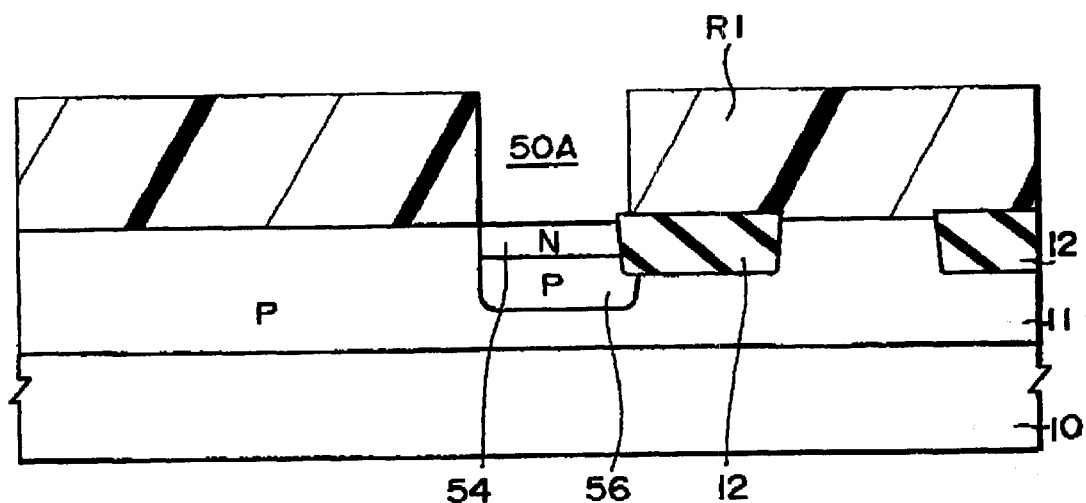
FIG. 9 is a cross section schematically showing a fabrication step of the semiconductor device shown in FIG. 8.

An example of the fabrication method of the semiconductor device according to the present embodiment will be described with reference to FIGS. 8 to 12. In this example, an n-channel MOS transistor is used for description. Description of the same steps as described in the first embodiment will be omitted (A) A p-type well 11 and isolation regions 12 are formed on the silicon substrate 10, as shown in FIG. 9 by a know method.

A resist layer R1 having an opening 50A in the area for forming a diode region 50 is then formed. By using-the resist. layer R1 as a mask, p-type impurities are introduced into the p-type well 11 by ion implantation to form an n-type impurity-diffusion layer 56. An n-type impurity-diffusion layer 54 is formed by ion implantation of n-type impurities into the p-type well 11 using the resist layer R1 as a mask. The impurity concentration and diffusion depth of these impurity-diffusion layers 54 and 56 are predetermined so that a Zener diode can be formed. The order of doping with n-type impurities and p-type impurities is not limited.

Figure 10:
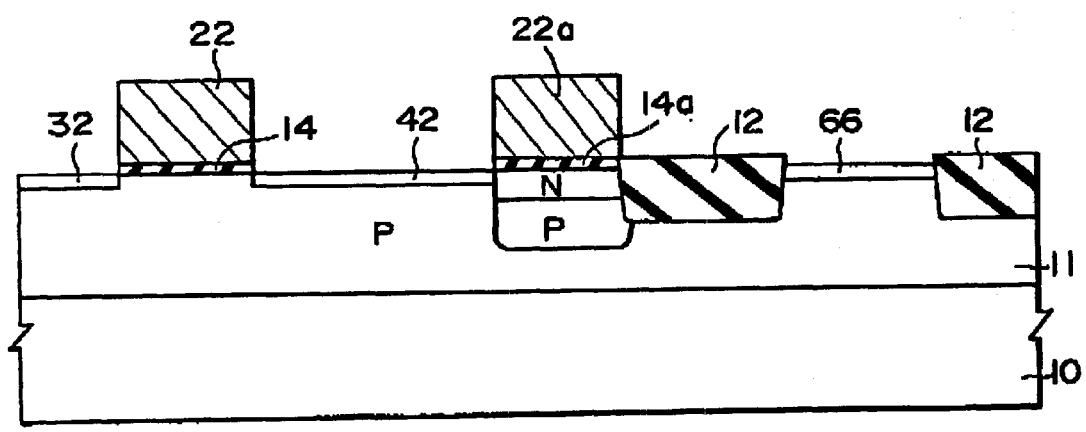
FIG. 10 is a cross section schematically showing a fabrication step of the semiconductor device shown in FIG. 8.

(B) A doped polysilicon layer (first conductive layer 22) constituting part of a gate insulation layer and a gate electrode is formed on the p-type well 11 using a known method, as shown in FIG. 10. At this time, an insulation layer 14a and a first conductive layer 22a to be used for forming the protection layer 58 are also formed.

Low-concentration n-type impurity-diffusion layers 32 and 42 respectively forming at least part of the source region 30 and drain region 40 are formed by using a resist layer (not shown in the Figures) as a mask.

Figure 11:
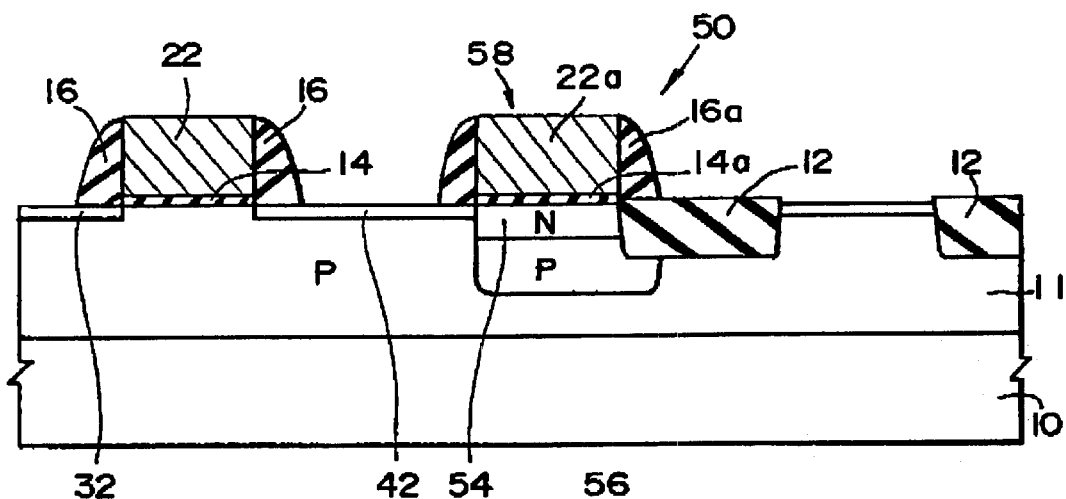
FIG. 11 is a cross section schematically showing a fabrication step of the semiconductor device shown in FIG. 8.

(C) Next, an insulation layer (not shown) for forming side wall insulation layers 16 in formed on the entire surface of the wafer, as shown in FIG. 11. This insulation layer is formed by depositing silicon oxide using a known method, for example, a CVD method. The insulation layer is then etched all over the surface by isotropic etching using dry etching. Consequently the side wall insulation layers 16 are formed on side surfaces of the gate insulation layer 14 and the first conductive layer 22 constituting part of the gate electrode. Side wall insulation layers 16a for the protection layer 58 are formed at the same time.

Figure 12:
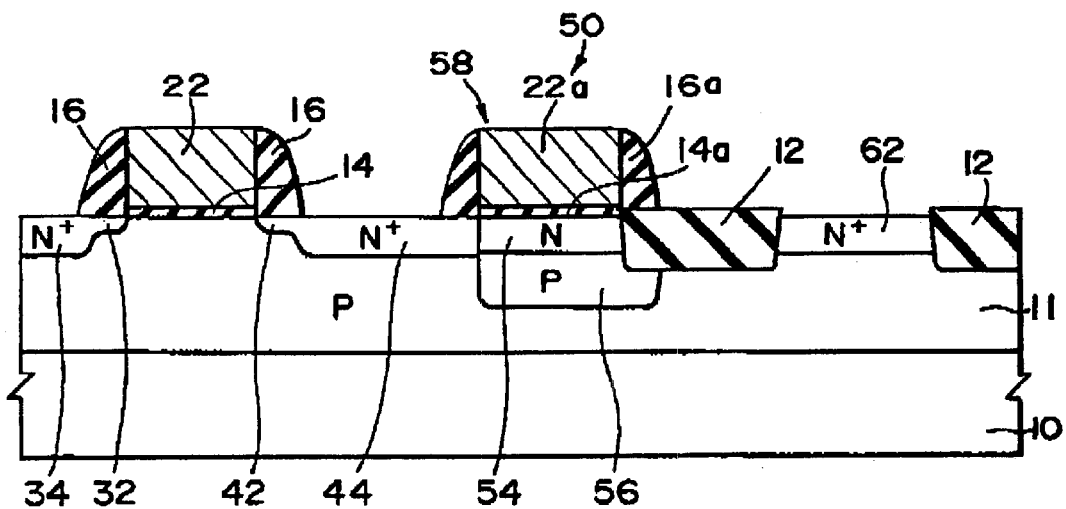
FIG. 12 is a cross section schematically showing a fabrication step of the semiconductor device shown in FIG. 8.

(D) Then, a high-concentration impurity-diffusion layer 34 for the source region, a high-concentration impurity-diffusion layer 44 for the drain region, and a high-concentration impurity-diffusion layer 62 for the emitter region are formed by ion implantation of n-type impurities such as phosphorus or arsenic using a known method, as shown in FIG. 12. In this step, since the side wall insulation layers 16, protection layer 58, and isolation regions 12 function as masks for ion implantation, the high-concentration impurity-diffusion Layers 34, 44, and 62 are formed while being self-aligned.

(E) A silicide layer is formed on the exposed area of the silicon substrate 10 and the surface of the doped polysilicon layer (first conductive layer) 22, as shown in FIG. 8, by using a known salicide process. Specifically, silicide layers 24, 36, 46, and 64 are formed on the first conductive layer 22, high-concentration impurity-diffusion layer 34 for the source region, high-concentration impurity-diffusion layer 44 for the drain region, and high-concentration impurity-diffusion layer 62 for the emitter region, respectively. The gate electrode 20, source region 30, drain region 40 of the NOS transistor 100, and the emitter region 60 are formed in this step. A silicide. layer 24a is also formed on the conductive layer 22a constituting part of the protection layer 58.

As described above, the protection layer 58 is formed to sufficiently cover the surface of the n-type impurity-diffusion layer 54 of the Zener diode so that part of the isolation region 12 and drain region 40 are also covered by the protection layer 58. Thus, the diode region 50 is composed of the p-type impurity-diffusion layer 56, n-type impurity-diffusion layer 54, and protection layer 58.

According to the above fabrication method, the protection layer 58 for the diode region SO is formed in the step of forming at least the gate insulation layer 14, gate electrode 20, and side wall insulation layers 16 of the MOS transistor 100. Therefore, an additional step is not required for forming the protection layer 58, thereby reducing the number of fabrication steps. Since other effects are the same as those in the first embodiment, description thereof is omitted.

Other Embodiments

The following are modifications of the first embodiment.

The impurity-diffusion layer of the second conductive type (n-type impurity-diffusion layer) 54 in the diode region 50 may be formed at the time of ion implantation with n-type impurities in the step (D) instead of the stop (B) of the fabrication method of the first embodiment.

The impurity-diffusion layer of the second conductive type (n-type impurity-diffusion layer) 54 of the diode region 50 may be formed at the time of ion implantation with n-type impurities for forming the low-concentration impurity-diffusion layers 32 and 34 for the source region 30 and the drain region 40 in the step (B), instead of being formed at the time of ion implantation for the Zener diode in the stop (B) of the fabrication method of the first embodiment.

What is claimed is:

1. A semiconductor device comprising:
an insulated-gate field-effect transistor which is formed in a first region of a first conductive type and includes a gate insulation layer, a sate electrode, side wall insulation layers formed on side surfaces of the gate electrode, a first impurity-diffusion layer of a second conductive type which is a source region, and a second impurity-diffusion layer of the second conductive type which is a drain region;

a bipolar transistor which includes the second impurity-diffusion layer as a collector region, part of the first region as a base region, and a third impurity-diffusion layer of the second conductive type which is electrically isolated from the second impurity-diffusion layer and is used as an emitter region; and a Zener diode formed of a fourth impurity-diffusion layer of the second conductive type which is continuously formed with the second impurity-diffusion layer, and a fifth impurity-diffusion layer of the first conductive type which is connected to the fourth impurity-diffusion layer, wherein silicide layers are formed on the surfaces of the first and second impurity-diffusion layers; and wherein a protection layer is formed on a surface of the fourth impurity-diffusion layer of the Zener diode.

2. The semiconductor device as defined in claim 1, wherein the protection layer is formed in a step of forming the side wall insulation layers.

3. The semiconductor device as defined in claim 1, wherein the protection layer comprises an insulation layer which is formed together with the gate insulation layer a conductive layer which is formed together with the gate electrode, and another insulation layer which in formed together with the side wall insulation layers.

4. The semiconductor device as defined in claim 1, wherein the Zener diode has a Zener voltage which is set to be lower than the avalanche breakdown voltage in the drain region.

5. The semiconductor device as defined in claim 1, wherein the Zener diode has a Zener voltage which is set to be lower than the snapback voltage in the drain region.

6. The semiconductor device as defined in claim 1, wherein the fourth impurity-diffusion layer of the Zener diode has an impurity concentration which is lower than the impurity concentration of the drain region.

* * * * *